United States Patent [19]
Tanizawa et al.

[11] Patent Number: 4,868,630
[45] Date of Patent: Sep. 19, 1989

[54] GATE ARRAY SEMICONDUCTOR INTEGRATED CIRCUIT

[75] Inventors: Tetsu Tanizawa, Kawasaki; Yoshiharu Mitono, Tokyo; Hitoshi Omichi, Kawasaki, all of Japan

[73] Assignee: Fujitsu Limited, Kawasaki, Japan

[21] Appl. No.: 769,800

[22] Filed: Aug. 27, 1985

Related U.S. Application Data

[63] Continuation of Ser. No. 416,496, Sep. 10, 1982, abandoned.

[30] Foreign Application Priority Data

Sep. 10, 1981 [JP] Japan .................. 56-142939
Sep. 10, 1981 [JP] Japan .................. 56-142940

[51] Int. Cl.⁴ .................. H01L 27/02; H01L 27/10
[52] U.S. Cl. .................. 357/45; 357/40; 357/41; 357/92
[58] Field of Search .................. 357/40, 41, 45, 92

[56] References Cited

U.S. PATENT DOCUMENTS

| | | | |
|---|---|---|---|
| 4,133,611 | 1/1979 | Baker | 357/45 |
| 4,278,897 | 7/1981 | Ohno et al. | |
| 4,295,149 | 10/1981 | Balyoz et al. | 357/45 |
| 4,412,237 | 10/1983 | Matsumura et al. | 357/41 |

FOREIGN PATENT DOCUMENTS 0005723 12/1979 European Pat. Off. .

*Primary Examiner*—J. Carroll
*Attorney, Agent, or Firm*—Staas & Halsey

[57] ABSTRACT

A semiconductor integrated circuit including at least one conventional inner cell region and an outer cell region. The outer cell region comprising a plurality of outer cells. Each outer cell is comprised of circuit elements for achieving a predetermined logic function, in addition to circuit elements for achieving the conventional buffer function of an outer cell. Further, two or more adjacent outer cells are connected each other and act as an independent circuit so as to form a macro-cell.

14 Claims, 10 Drawing Sheets

Fig. 3
Fig. 4
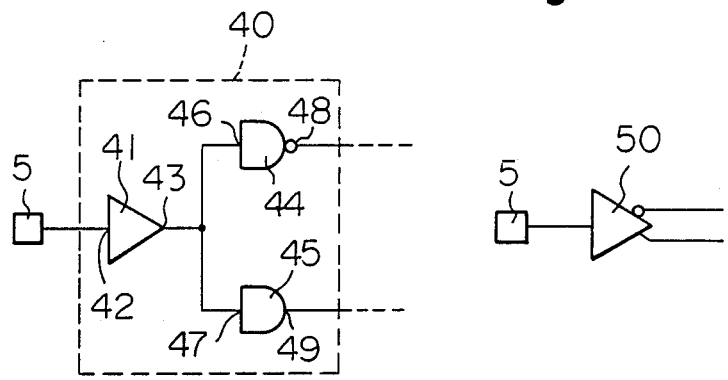
Fig. 5
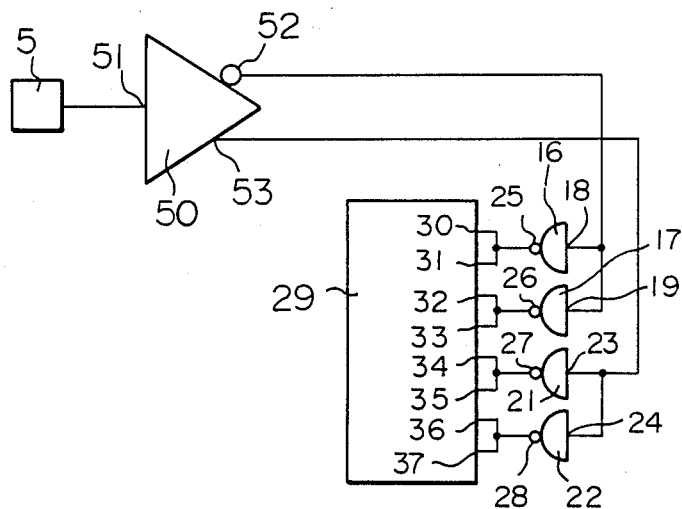

(A)

(B)

(C)

(D)

(E)

(F)

GATE ARRAY SEMICONDUCTOR INTEGRATED CIRCUIT

This is a continuation of co-pending application Ser. No. 416,496 filed on Sept. 10, 1982, abandoned.

CROSS REFERENCE TO RELATED APPLICATION

This application is related to U.S. Ser. No. 416,497 filed Sept. 10, 1982, by the inventors of the present application, and assigned to the assignee of the present invention abandoned in favor of U.S. Pat. No. 750,642 filed June 25, 1985, abandoned in favor of U.S. Pat. No. 915,859 filed Oct. 6, 1986, abandoned.

BACKGROUND OF THE INVENTION

1. Field of the Invention

The present invention relates to a semiconductor integrated circuit (IC), more particularly to an IC of a semi-custom type in which prefabricated circuit elements are suitably wired in accordance with individual user needs during the IC production process by using, for example, metal sputtering.

2. Description of the Prior Art

One type of such an IC is a masterslice gate array large-scale integrated circuit (LSI), comprising a bulk including a plurality of basic cells arranged in a plurality of arrays. The wiring inside each basic cell and between each basic cell can be designed automatically with the aid of a computer, to produce many varieties of products from one type of bulk.

A typical masterslice gate array LSI is fabricated as follows. First, an inner cell region is located at the center portion of the surface of a substrate. In this region, a plurality of inner cells, each provided with a plurality of circuit elements, are arranged in a plurality of arrays. Second, an outer cell region, i.e. an input/output (I/O) buffer cell region, is located close to and along a peripheral portion of the surface of the substrate. In this region, a plurality of outer cells, i.e. I/O cells, each provided with a plurality of circuit elements, are arranged. Each of the I/O cells achieves operation for a level conversion between signals appearing in the inner cells and signals appearing outside the masterslice gate array LSI. Third, at least a first wiring layer and a second wiring layer are provided as multilayers located on and above the substrate for distributing lines between the circuit elements. The circuit elements of the inner cells are suitably connected by lines distributed on the first and second wiring layers so as to create desired logic circuits. Power belts are also distributed on the second wiring layer along and above the I/O cell region.

In the above-mentioned typical masterslice gate array LSI, the I/O cell region functions only for level conversion. Thus, the efficiency of utilization of the circuit elements on the LSI chip has not been that high.

SUMMARY OF THE INVENTION

It is an object of the present invention to maximize the efficiency of utilization of the circuit elements on the LSI chip.

The above object is attained by an IC comprising: a semiconductor substrate having a center portion and a peripheral portion; first and second level wiring layers formed on the semiconductor substrate, the second level wiring layer being formed over the first level wiring layer; an inner cell region located at the center portion of the semiconductor substrate, the inner cell region comprising a plurality of inner cells which are arranged in an array and connected by the second wiring layer, each of the inner cells comprising a plurality of circuit elements inter-connected by the first level wiring layer; and an outer cell region located at the peripheral portion of the semiconductor substrate, the outer cell region comprising a plurality of outer cells each of which comprises a plurality of circuit elements inter-connected by the first level wiring layer, the plurality of circuit elements in the outer cell region being selectively connected to each other so that at least one of the outer cells has a different function from the others.

The present invention will be more apparent from the ensuing description with reference to the accompanying drawings.

BRIEF DESCRIPTION OF THE DRAWINGS

FIG. 3 is a circuit diagram of a first embodiment according to the present invention;

FIG. 4 is a diagram schematically representing the I/O cell (outer cell) of FIG. 3;

FIG. 5 is a circuit diagram of a modification of the conventional IC shown in FIG. 2, according to the present invention;

DESCRIPTION OF THE PREFERRED EMBODIMENTS

Figure 1A:
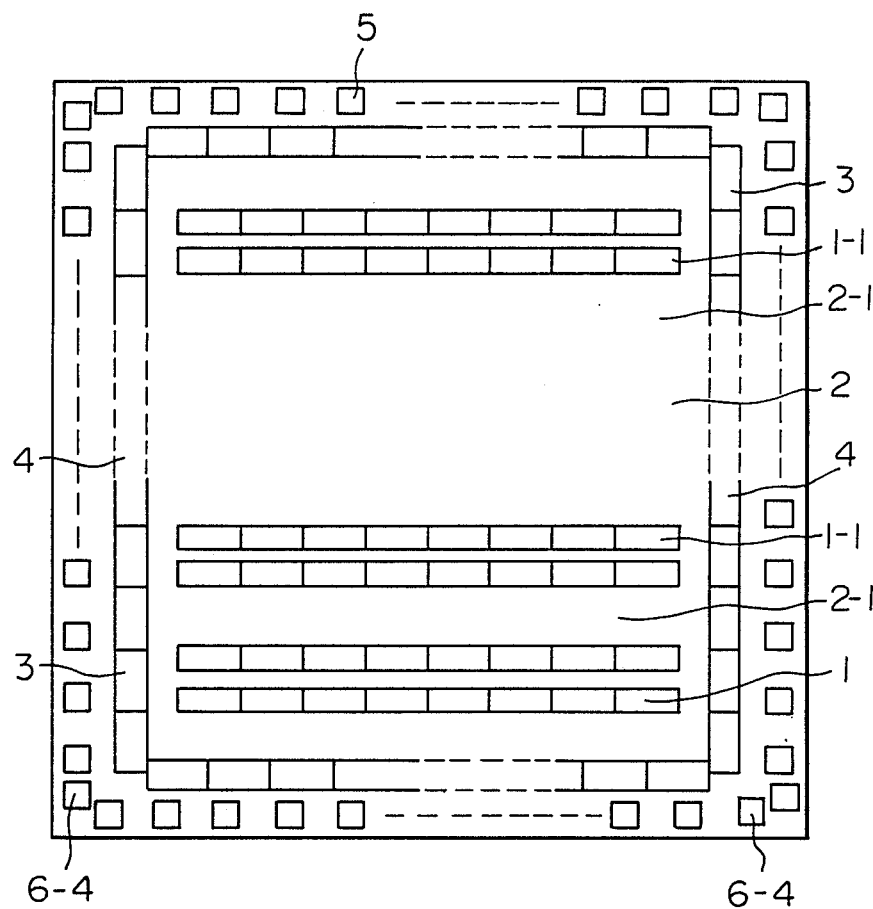
FIG. 1A is a plan view of one example of a typical IC.
Figure 1B:
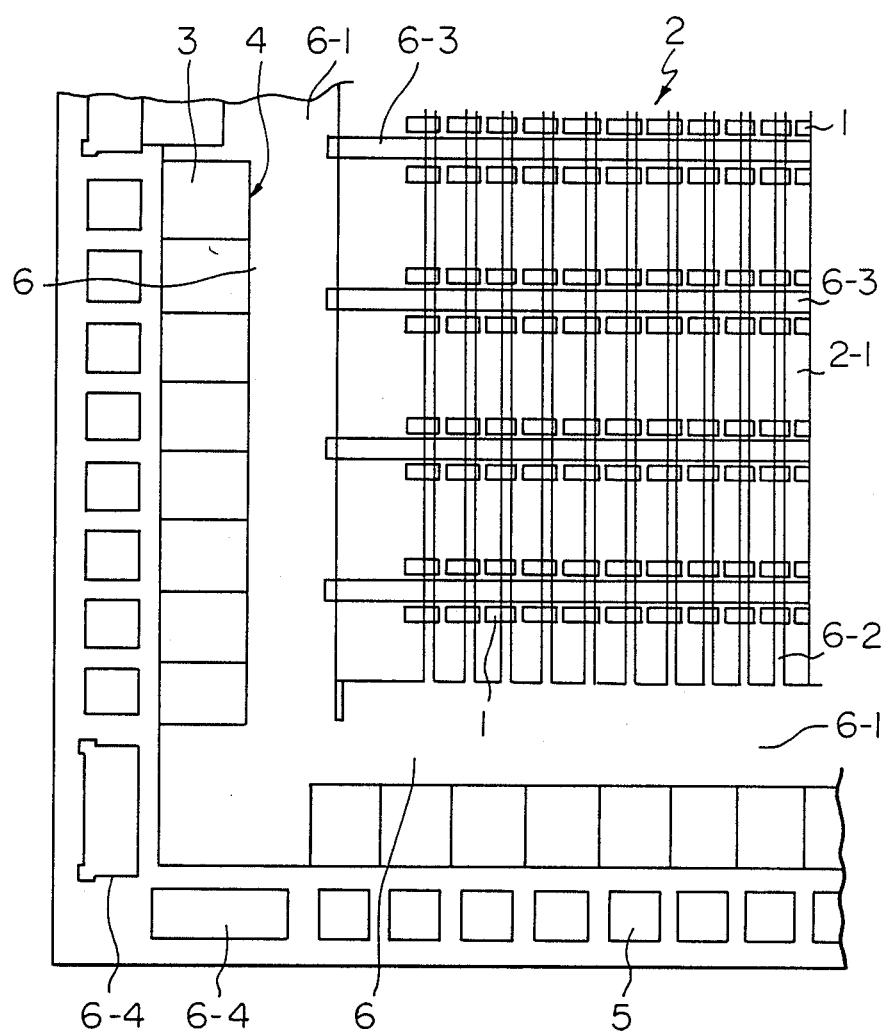
FIG. 1B is an enlarged plan view of one corner part of the IC shown in FIG. 1A.
Figure 1C:
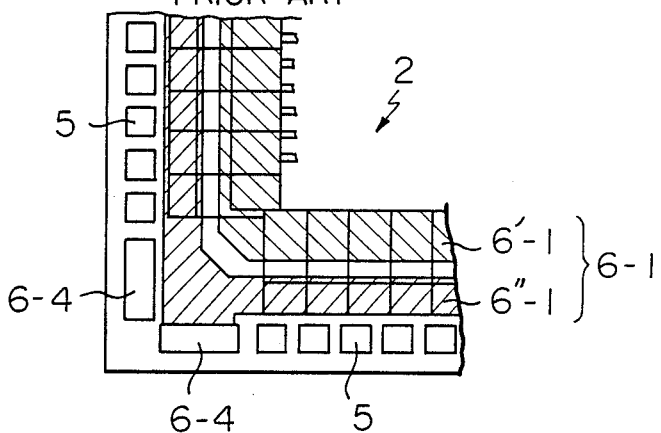
FIG. 1C is a reduced plan view of power sources located above an I/O cell region (outer cell region) of FIG. 1B.

FIG. 1A is a plan view of one example of a typical IC. The circuit is fabricated as a masterslice gate array LSI on a single chip. FIG. 1B is an enlarged plan view of one corner part of the IC shown in FIG. 1A. The gate array LSI is comprised as follows. Reference numeral 1 represents an inner cell. A plurality of inner cells are arranged in each array 1-1. A wiring region 2-1, or "channel region", is located between each of two pairs of arrays 1-1. The wiring regions 2-1 are used for the computer-aided automatic wiring of lines between two or more corresponding inner cells. Reference numeral 2 represents an inner cell region located at the center of the LSI chip and comprises many logic circuits. Reference numeral 4 represents an outer cell region, hereinafter called an I/O cell region. The I/O cell region 4 is located close to and along the peripheral portion of the LSI chip and at the same time outside the inner cell region 2. The I/O cell region 4 comprises a plurality of outer cells, i.e. I/O (buffer) cells 3, which operate as electric interfaces between the inner cells 1 and the external circuits of the LSI chip. That is, the I/O cells 3 achieve operations for level conversions between signals appearing inside and outside the LSI chip. Reference numeral 6 (FIG. 1B) represents a power source. The power source 6 comprises: first, $V_{CC}$ power belts and ground belts 6-1, both located as plane-like belts along the peripheral portion of the LSI chip and above the I/O cell region 4; second, ground lines 6-2 arranged above the inner cell region 2 in a vertical direction in FIG. 1B and on the second wiring layer; third, $V_{CC}$ power lines 6-3 arranged above the inner cell region 2 in a horizontal direction in FIG. 1B and on the first wiring layer; and, fourth, power source pads 6-4. It should be understood that although the above-mentioned power belts, power lines, ground belts, and ground lines are located on the first wiring layer and/or the second wiring layer, these members are illustrated in FIG. 1B as if they were located on the same plane. Reference numeral 5 represents signal line pads to be connected to the corresponding I/O cells 3. FIG. 1C is a reduced plan view, for illustrating the power sources located above the I/O cell region 4 of FIG. 1B. In FIG. 1C, the $V_{CC}$ power belt 6'-1 is arranged in parallel with the ground belt 6''-1 with a small pitch therebetween. The power source pad 6-4 is used for the $V_{CC}$ power belt 6'-1 via through holes (not shown). It should be understood that in FIG. 1C, the hatchings illustrated in the belts 6'-1 and 6''-1 do not indicate cross-sections as usual, but are merely for distinguishing one location from another.

Generally, in gate array LSI chips, the lines connecting circuit elements of the inner cells 1 and I/O cells 3 are arranged primarily in the X direction on the first wiring layer, primarily in the Y direction on the second wiring layer, and down the through holes for connection between the first and second wiring layers.

The inner cell region 2 is located at the center of the LSI chip, and the I/O cell region 4 is located between the inner cell region 2 and the signal line pads 5. The power belts 6-1 are mounted on the second wiring layer and above the I/O cell region 4. The lines to be arranged between the power belts 6-1 and the inner cell region 2 are formed as the thin ground lines 6-2 and the thin $V_{CC}$ power lines 6-3 on the second and first wiring layers, respectively. Consequently, the configuration of the I/O cell region 4 is mainly restricted by the power belts 6-1. That is, the locations of the I/O cell regions 4 and the power belts 6-1 are usually almost identical to each other.

On the other hand, each of the inner cells 1 and the I/O cells 3 is a combination of various kinds of circuit elements, such as transistors, diodes, resistors, and capacitors. In each of these cells, these circuit elements are selectively connected to obtain the desired basic logic circuits. Such cells are called basic cells. The lines to be arranged inside the basic cells are formed on the first wiring layer, while the lines to be arranged between two or more basic cells are formed on the first and second wiring layers. Since the lines to be connected between the inner cells 1 are arranged utilizing the first and second wiring layers, there is a considerably high freedom in wiring. However, since the second wiring layer, located above the I/O cell region 4, is already occupied by the power belts 6-1, the lines to be connected between the circuit elements of the I/O cells 3 have to be formed mainly on the first layer. Thus, there is less freedom in wiring with the I/O cells 3 than with the inner cells 1. In addition, the lines for the I/O cell region 4 should be prearranged.

Further, the inner cells 1 must be formed as small as possible, in order to obtain high speed operation and high LSI integration. However, the I/O cells 3 must be formed relatively large in order to produce high power for driving the loads. Furthermore, the power voltage and threshold voltage applied to the inner cells 1 must be lower than those of the I/O cells 3 in order to attain low power consumption in the inner cells 1. Therefore, the threshold voltage level of the external circuit of the LSI chip must be matched with the lowered threshold voltage level of the inner cells 1 through a level converting operation by the I/O cells 3. As mentioned above, the I/O cells 3 and the inner cells 1 differ in function and size. Accordingly, cells 1 and 3 cannot be treated as identical cells in computer-aided automatic wiring operations.

As previously mentioned, the object of the present invention is to maximize the efficiency of utilization of the circuit elements on the LSI chip. One way of doing this is explained immediately below. A second way will be explained later.

Along and on the peripheral portion, the power belts 6-1 and the I/O cell region 4 are formed as a multilayer structure. Therefore, the area allotted to the I/O cell region 4 is determined by the area occupied by the power belts 6-1. Accordingly, the area allotted to the I/O cells 3 must be smaller than that of the power belts 6-1. This results in a nonused region, that is, an empty region, adjacent to the I/O cell region 4. The higher the integration of the gate array LSI and the larger the width of the power belts 6-1, the greater the area of the empty region.

Regarding the input signal for the inner cell region 2, it is usually necessary to employ two inner cells at the output side of the I/O cell 3, in a case where the logic circuits of the inner cell region 2 require both inverted and non-inverted input signals simultaneously, with respect to the external signal. This is because, each I/O cell 3 cannot achieve both buffering and inverting functions. Therefore, one of the two inner cells must be allotted for the buffering function, while the other thereof must be allotted for the inverting function.

Figure 2:
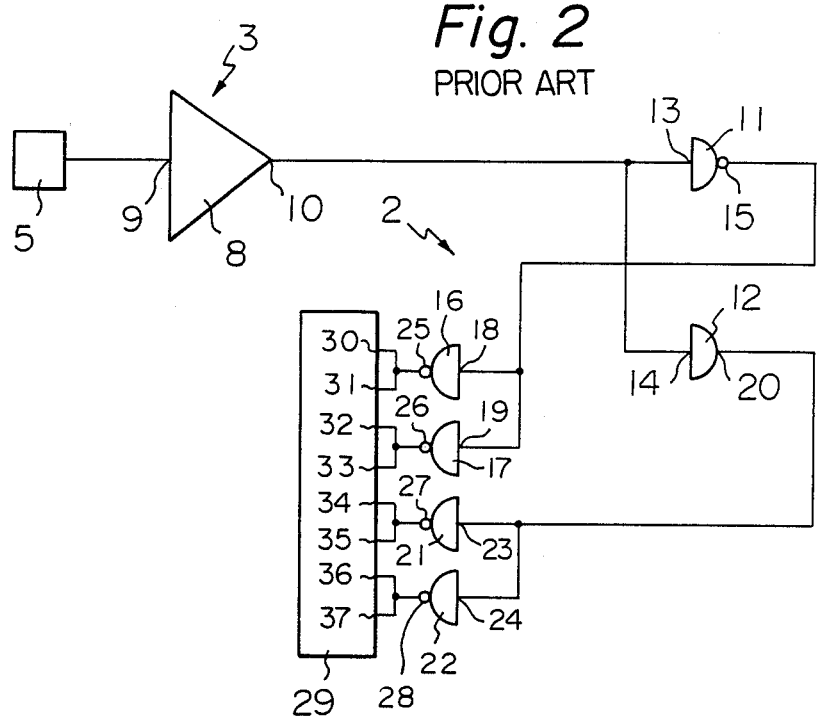
FIG. 2 is a block diagram of one exmaple of a conventional IC.

A more specific explanation follows with reference to FIG. 2. FIG. 2 is a block diagram of one example of a conventional IC. In FIG. 2, the signal line pad 5 is connected to an input 9 of a buffer 8 included in the I/O cell 3 contained in the I/O cell region 4. An output 10 of the buffer 8 is connected to both an input 13 of an inverter 11 and an output 14 of a buffer 12. Both the inverter 11 and the buffer 12 are fabricated inside the inner cell region 2. A signal from an output 15 of the inverter 11 is applied to both inputs 18 and 19 of inverters 16 and 17, respectively. A signal from an output 20 of the inverter 12 is applied to both inputs 23 and 24 of inverters 21 and 22, respectively. Outputs 25, 26, 27, and 28 of respective inverters 16, 17, 21, and 22 are connected in a logic circuit group 29 to inputs 30, 31, inputs 32, 33, inputs 34, 35, and inputs 36, 37, respectively. An input signal is applied to the LSI chip through the signal line pad 5 and then applied to the buffer 8 in the I/O cell 3, in which the level of the input signal is converted into the signal level specified for the inner cell region 2. The output signal from the buffer 8 is applied to both buffer 12 and the inverter 11 and thereby both non-inverted and inverted signals, with respect to the input signal, are respectively formed therethrough. These non-inverted and inverted input signals are supplied to the logic circuit group 29 at its inputs 30 through 37. If the logic circuit group 29 thus requires both noninverted and inverted input signals, the buffer 12 and the inverter 11 must be fabricated by two inner cells 1 inside the inner cell region 2 and between the inputs of the logic circuit group 29 in the region 2 and the buffer 8 in the region 4. As a result, the efficiency of utilization of the inner cells 1 in the inner cell region 2 is reduced due to the presence of the inverter 11 and buffer 12 in the region 2.

Conventional gate array LSI's frequently have inverter 11 and buffer 12 fabricated by using two inner cells 1 between the inputs of the logic circuit group and the buffer 8 in the I/O cell 3. Introducing such a prearranged construction in the inner cell region 2, however, is not preferable in terms of efficiency of utilization of the inner cells 1, because it reduces the high degree of freedom in wiring in the region 2.

According to the present invention, the above-mentioned conventional construction for performing logic functions and prearranged the location and use of the inner cells 1, is replaced by using the I/O cells 3. This can easily be done because the region for the I/O cells 3 is increased in proportion to the recent increase of the area to be occupied by the power belts. In other words, the prearranged construction for performing logic functions is realized in a region having a relatively low degree of freedom in wiring, that is, in the region 4. This eliminates the prearranged construction for logic functions from the inner cell region 2, having a high degree of freedom in wiring, enabling more variable constructions for other logic functions to be incorporated into this region.

FIG. 3 is a circuit diagram of a first embodiment according to the present invention. In an I/O cell 40, a buffer 41 for converting the level of signal is fabricated. An input signal is applied through the signal line pad 5 to an input 42 of the buffer 41. The output 43 of the buffer 41 is connected to inputs 46 and 47 of an inverter 44 and a buffer 45, respectively, both located in the same I/O cell 40. Output signals of the I/O cell 40 are produced from outputs 48 and 49 of the inverter 44 and the buffer 45, respectively.

FIG. 4 is a diagram schematically representing the I/O cell of FIG. 3. In FIG. 4, a circuit corresponding to that of FIG. 3 is indicated as an output circuit 50 for producing both inverted and non-inverted signals.

FIG. 5 is a circuit diagram of a modification of the conventional IC shown in FIG. 2, according to the present invention. This modification is made based on the circuits shown in FIGS. 3 and 4, representing one example of the present invention. Reference numerals the same as those in FIG. 2 represent the same member. The signal line pad 5 is connected to an input 51 of the output circuit 50 for producing both inverted and non-inverted signals. An inverting output 52 of the circuit 50 is connected to both inverters 16 and 17. A non-inverting output 53 thereof is connected to both inverters 21 and 22. Accordingly, only the inverters 16, 17, 21, 22, and the logic circuit group 29 are formed inside the inner cell region 2.

As understood from the circuits shown in FIGS. 3, 4, and 5 according to the present invention, the I/O cell 40 can also function to both non-invert and invert a signal. Therefore, the inner cells 1 for fabricating the buffer and inverter used for achieving the same function as mentioned above are not needed in the inner cell region 2. The inverter 44 and the buffer 45 to be fabricated in the I/O cell 40 of FIG. 3 are built as a multilayer construction together with the aforesaid power belts 6-1 (FIG. 1C). At the same time, the inverter 44 and the buffer 45 can be fabricated in the aforementioned empty region located under the power belts and adjacent to the I/O cell region 4. Since the inverter 44 and the buffer 45 are inserted into the empty region, the size of the LSI chip according to the present invention is exactly the same as that of a similar LSI chip of typical type. In addition to this, the efficiency of utilization of the inner cells 1 in the region 2 in the present invention can be increased over that of the typical inner cell region.

Further, it is clear that current branches in the inner cell region 2 are also reduced.

Figure 6:
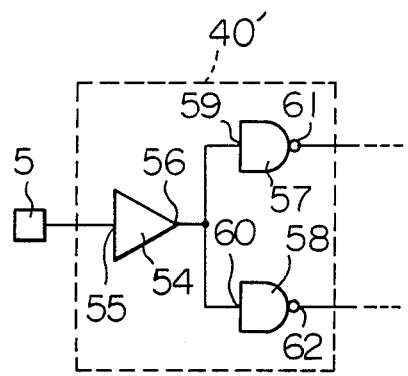
FIG. 6 is a circuit diagram of a second embodiment according to the present invention.

FIG. 6 is a circuit diagram of a second embodiment according to the present invention. In an I/O cell 40', two inverted signals with respect to an input signal applied thereto can be produced therefrom. That is, the signal line pad 5 is connected to an input 55 of a buffer 54, and an output 56 of the buffer 54 is connected to both inputs 59 and 60 of respective inverters 57 and 58. The output signals of the I/O cell 40' are produced from outputs 61 and 62 of respective inverters 57 and 58.

Figure 7:
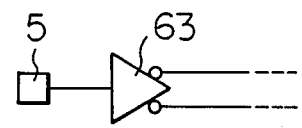
FIG. 7 is a diagram schematically representing the I/O cell of FIG. 6.

FIG. 7 is a diagram schematically representing the I/O cell of FIG. 6. In FIG. 7, the circuit corresponding to that of FIG. 6 is indicated as an output circuit 63 for producing two inverted signals.

Figure 8:
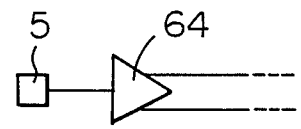
FIG. 8 is a diagram schematically representing an I/O cell similar to that of FIG. 6.

FIG. 8 is a symbolic diagram schematically representing an I/O cell similar to that of FIG. 6. In FIG. 8, the circuit corresponding to that of FIG. 6 is indicated as an output circuit 64 for producing two non-inverted signals with respect to an input signal. However, both the inverters 57 and 58 of FIG. 6 are replaced by buffers such as the buffer 45 of FIG. 3.

The existence of two inverted or two non-inverted outputs in a single I/O cell allows, for example, twice the load to be driven compared with a similar I/O cell of a conventional type. This is also true in the aforementioned first embodiment.

Figure 9:
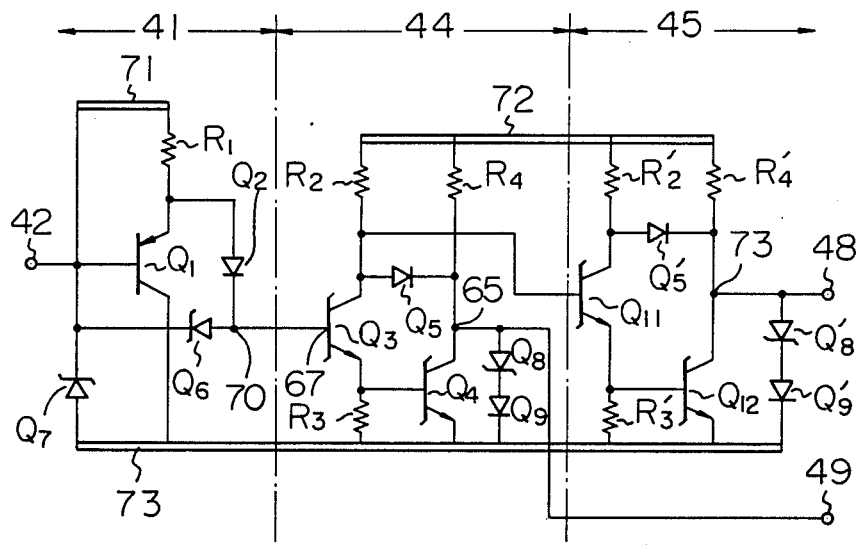
FIG. 9 is a detailed circuit diagram of the first embodiment of FIG. 3.

FIG. 9 is a detailed circuit diagram of the first embodiment of FIG. 3. As previously mentioned, the I/O cell 40 comprises the buffer 41 for the level conversion, the inverter 44, and also the buffer 45. In FIG. 9, terminals 42, 48, and 49 and circuits 41, 44, and 45 correspond to those shown in FIG. 3. A level conversion part, that is, the buffer 41 of FIG. 3, is comprised of a resistor $R_1$, diodes $Q_2$, $Q_6$, $Q_7$, and a transistor $Q_1$. An inversion part, that is the inverter 44 of FIG. 3, is comprised of resistors $R_2$, $R_3$, $R_4$, diodes $Q_5$, $Q_8$, $Q_9$, and transistors $Q_3$, $Q_4$. A buffering part, that is, the buffer 45 of FIG. 3, is comprised of resistors $R_2'$, $R_3'$, $R_4'$, diodes $Q_5'$, $Q_8'$, $Q_9'$, and transistors $Q_{11}$, $Q_{12}$. The input of the buffer 41 for the level conversion corresponds to the base of the transistor $Q_1$. The output of the buffer 41 is located at an interconnecting point 70 between the diodes $Q_2$ and $Q_6$. Both the inputs of the inverter 44 and the buffer 45 are located at a base 67 of the transistor $Q_3$. The output of the inverter 44 is located at a point 65 between the diodes $Q_5$ and $Q_8$ and is also connected to the transistor $Q_4$. The output of the buffer 45 is located at a point 73 between the diodes $Q_5'$ and $Q_8'$ and is also connected to the transistor $Q_{12}$.

In FIG. 9, the $V_{CC}$ power line 71 for energizing the buffer 41 has a voltage of, for example, 5 V with respect to ground line 73, while the $V_{CC}$ power line 72 for energizing both the inverter 44 and the buffer 45 has a voltage of, for example, 2.3 V. Therefore, the buffer 41 can achieve level conversion at different operating voltages.

Thus, as mentioned above, some logic circuits, such as an inverter, a buffer, and so on, conventionally fabricated by utilizing the inner cells 1 are fabricated in the present invention by utilizing the I/O cells 3. The efficiency of utilization of the inner cells can be increased, because the inner cells which would conventionally be employed for certain logic circuits can be used to create other logic circuits. Therefore, further complicated logic functions can be realized.

As previously mentioned the object of the present invention is to increase the efficiency of utilization of the circuit elements on the LSI chip. The reasons for this are derived from two facts. The first way of doing this was explained above. Now, the second way will be explained.

Figure 10:
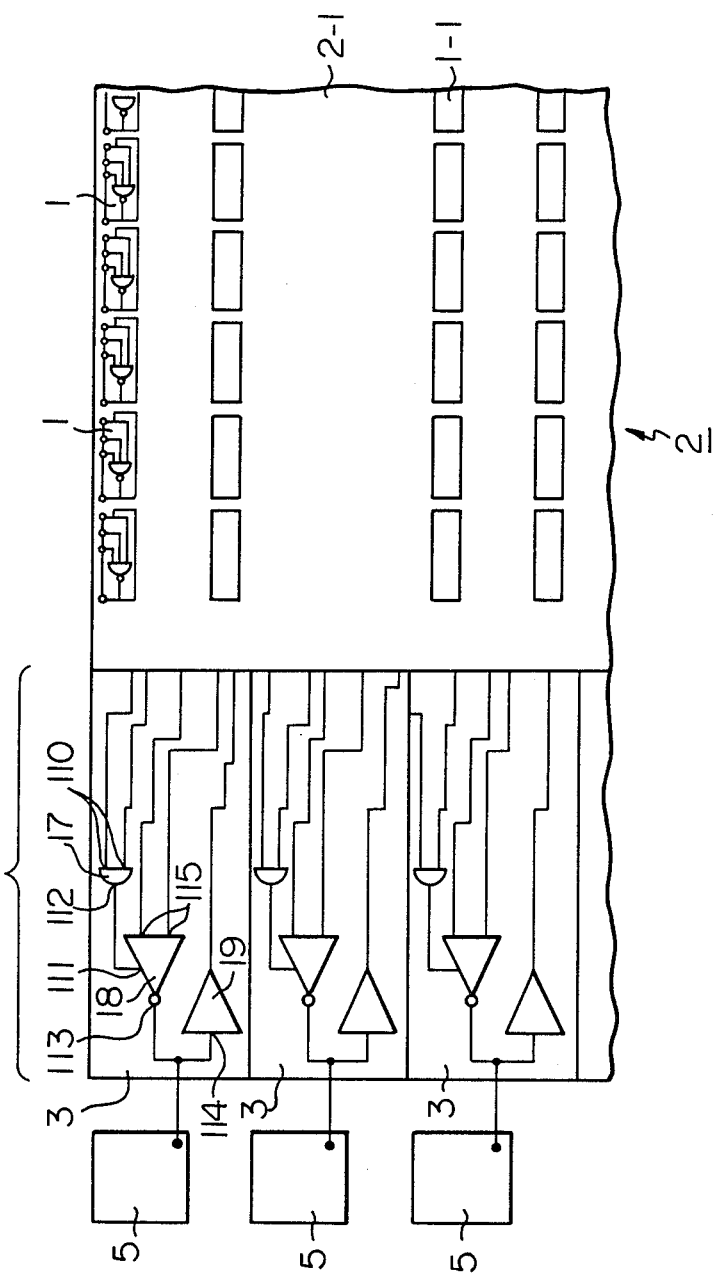
FIG. 10 is a partial plan view of one example of a conventional IC.

FIG. 10 is a partial plan view of one example of a conventional IC. In FIG. 10, one of the I/O cells 3 comprises for example, a AND gate 17, an NAND gate 18, and a buffer 19. Two inputs 110 of the AND gate 17 are connected to the corresponding inner cells 1 (the connections are not shown in FIG. 10). The output of the AND gate 17 is connected to a control input 111 which acts as an enable terminal of a tri-state NAND gate 18. The signal line pad 5 is connected, on one hand, to the output 113 of the NAND gate 18, on the other hand, to the input 114 of the buffer 19. Two inputs 115 of the NAND gate 18 and also an output of the buffer 19 are connected to the corresponding inner cells 1 (the connections are not shown in FIG. 10). Further, each I/O cell 3 is connected to the corresponding one of the signal line pads 5. It should be noted that, as shown in FIG. 10, the I/O cells 3 are all independent from each other. Therefore, no logic circuit is constructed by using adjacent I/O cells 3.

On the other hand, as previously mentioned, along and on the peripheral portion, the power belts 6-1 and the I/O cell region 4 are formed as a multilayer structure. Therefore, the area allotted to the I/O cell region 4 is determined by the area occupied by the power belts 6-1. Accordingly, the area allotted to the I/O cells 3 must be smaller than that of the power belts 6-1. This results in a nonused region, that is, an empty region, adjacent to the I/O cell region 4. The higher the integration of the gate array LSI and the larger the width of the power belts 6-1, the greater the area of the empty region.

Further, regarding the input signal for the inner cell region 2, it is usually necessary to employ two inner cells at the output side of the I/O cell 3, in a case where the logic circuits of the inner cell region 2 require both inverted and non-inverted input signals simultaneously, with respect to the external signal. This is because, each I/O cell 3 cannot achieve both buffering and inverting functions. Therefore, one of the two inner cells must be allotted for the buffering function, while the other thereof must be allotted for the inverting function.

Furthermore, in a case where some logic operation is to be effected on the input signal, for example, a latch function is to be effected on the input signal, a logic circuit for performing this latch function is conventionally formed by using only the inner cells 1.

According to the present invention, first, as already mentioned, one or more logic circuits which would conventionally be created by using the inner cells in the inner cell region, are created in the I/O cell region by using circuit elements of the I/O cells. Second, as will be explained in detail hereinafter, two or more adjacent I/O cells are connected to create a macro-cell. Thus, a logic circuit for performing complicated logic functions can be constructed, as a macro-cell logic circuit, in the I/O cell region 4. To be more specific, the circuit elements of each I/O cell are connected by lines distributed on at least the first wiring layer, the thus connected two or more adjacent I/O cells are connected to each other by lines distributed on the first wiring layer, and thereby the macro-cell logic circuit is constructed. The macrocell logic circuit is fabricated by using both the circuit elements in the I/O cells and the lines connecting therewith distributed on at least the first wiring layer located above the I/O cell region.

Figure 11:
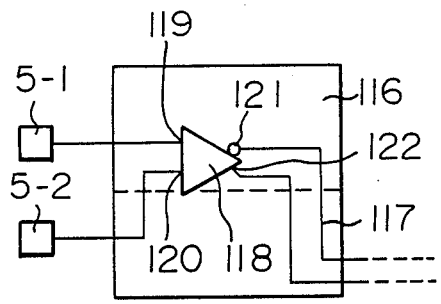
FIG. 11 is a circuit diagram of a third embodiment according to the present invention.

FIG. 11 is a circuit diagram of a third embodiment according to the present invention. In FIG. 11, a 2-input logic output circuit for producing both inverted and noninverted signals is formed as the macro-cell logic circuit by using two adjacent I/O cells 116 and 117. The signal line pads 5-1 and 5-2 are connected with respective inputs 119 and 120 of the 2-input logic output circuit 118. Both the inverting input 122 and non-inverting output 121 thereof are connected to the corresponding logic circuit fabricated by I/O cell or I/O cells 1 (the connections are not shown in FIG. 11).

Figure 12A:
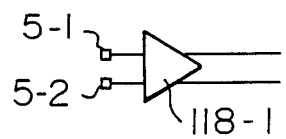
FIG. 12A is a circuit diagram of a fourth embodiment according to the present invention.
Figure 12B:
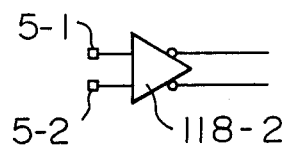
FIG. 12B is a circuit diagram of a fifth embodiment according to the present invention.

FIG. 12A is a circuit diagram of a fourth embodiment according to the present invention, and FIG. 12B is a circuit diagram of a fifth embodiment according to the present invention. The fourth and fifth embodiments provide macro-cell logic circuits comprised of two I/O cells 3. In FIG. 12A, the two outputs of the logic circuit 118-1 produce non-inverted signals with respect to the input signal. In FIG. 12B, the two outputs of the logic circuit 118-2 produce inverted signals with respect to the input signal. Since each of the logic circuits 118-1 and 118-2 has two inputs, two signal line pads 5-1 and 5-2 are necessary.

Figures (a)–(j) are six circuit diagrams of sixth, seventh, eighth, ninth, tenth, and eleventh embodiments according to the present invention. In the sixth embodiment of FIG. 13(a), the signal line pad 5-1 is connected to the input 124 of a logic circuit 123. The logic circuit 123 has two nonverting outputs 125 and 126 and two inverting outputs 127 and 128 with respect to the input signal supplied from the pad 5-1. These outputs are connected to the corresponding logic circuit (not shown) formed in the inner cell region 2 (FIG. 10). On the other hand, the output signals from the inner cell region 2 are applied to inputs 130, 131, and 132 of a logic circuit 129. Then, in the logic circuit 129, a predetermined logic operation, for example, an AND logic operation is executed, and the resultant logic output signal is produced at its output 133 and supplied to the pad 5-2. The macro-cell logic circuit (123 and 129) is comprised of two I/O cells 3 (FIG. 10), as clarified with reference to FIG. 14 mentioned hereinafter.

In the seventh and eighth embodiments shown in of FIG. 13(B) and (C) respectively, logic circuits 134 and 135 produce, at their four outputs, the inverted signals and the non-inverted signals with respect to their input signals.

Figure 13:
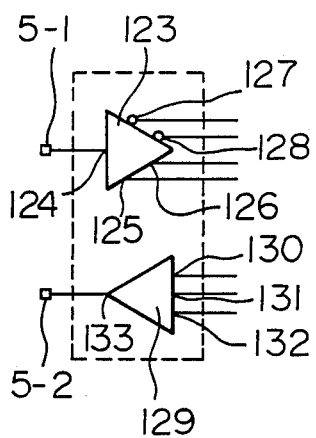
FIGS. 13 (A),(B),(C),(D),(E) and (I) are circuit diagrams of sixth, seventh, eighth, ninth, tenth, and eleventh embodiments, respectively, according to the present invention.
Figure 13:
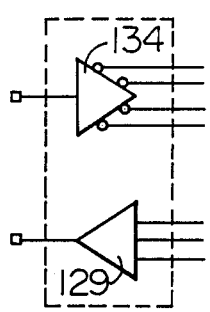
Figure 13:
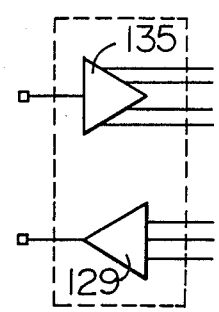
Figure 13:
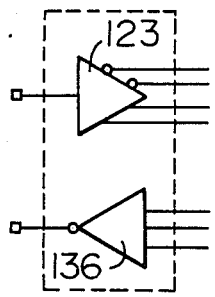
Figure 13:
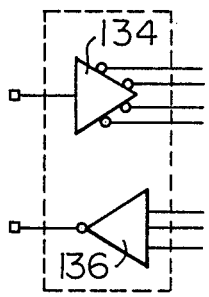
Figure 13:
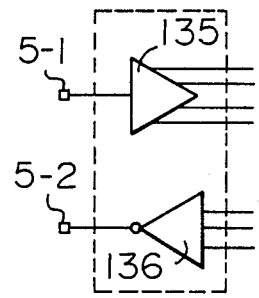

The ninth, tenth, and eleventh embodiments shown respectively in FIGS. 13 (D), (E), and (F) correspond to the sixth, seventh, and eighth embodiments, shown in FIG. 13(A), (B), and (C), except that the output logic circuits 129, each providing output signals outside the LSI chip, are replaced with logic output circuits 136, each providing an inverted signal with respect to a signal supplied from a corresponding logic circuit in the inner cell region 2 (FIG. 10).

Figure 14:
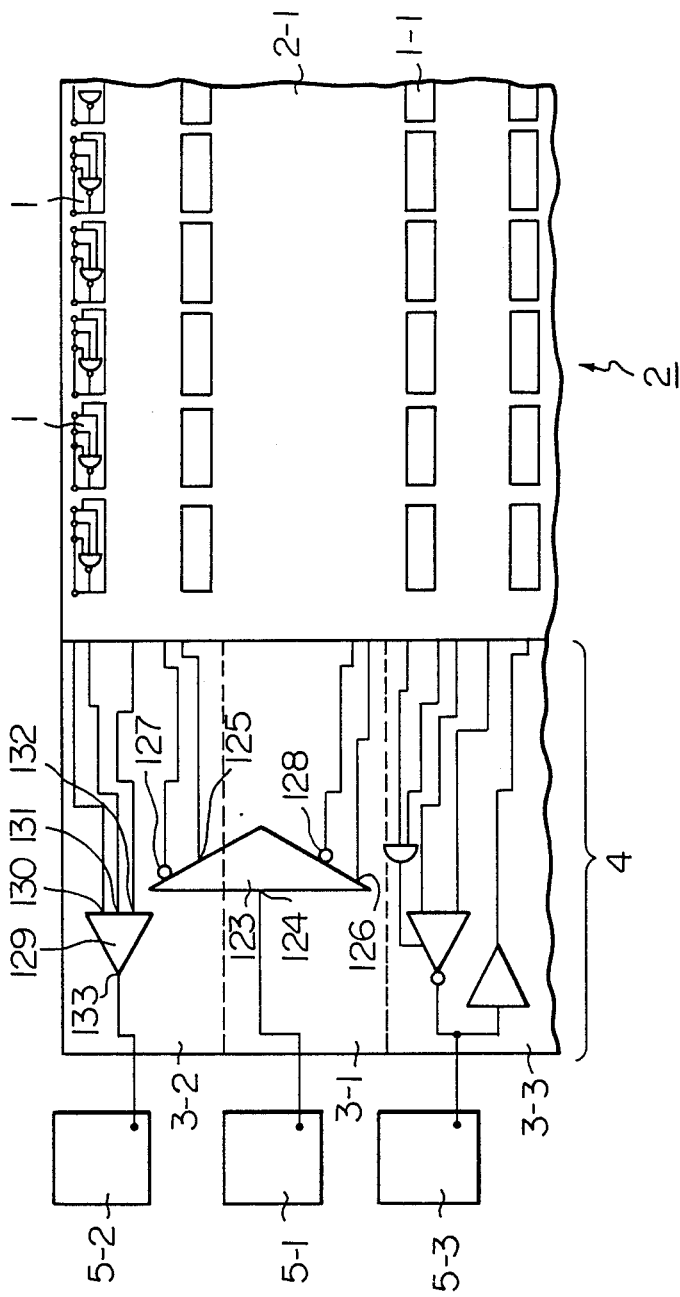
FIG. 14 is a detailed circuit diagram of the sixth embodiment shown in FIG. 13(A)

FIG. 14 is a detailed circuit diagram of the circuit of the sixth embodiment of FIG. 13(a). In FIG. 14, the macro-cell logic circuit 123 having an input 124 from the pad 5-1 is fabricated by using two adjacent I/O cells 3-1 and 3-2. A semi-macro-cell logic circuit 129 can be fabricated by using a part of the I/O cell 3-2. In FIG. 14, the pad 5-3 and the I/O cell 3-3 are used for creating another macro-cell logic circuit.

Figure 15:
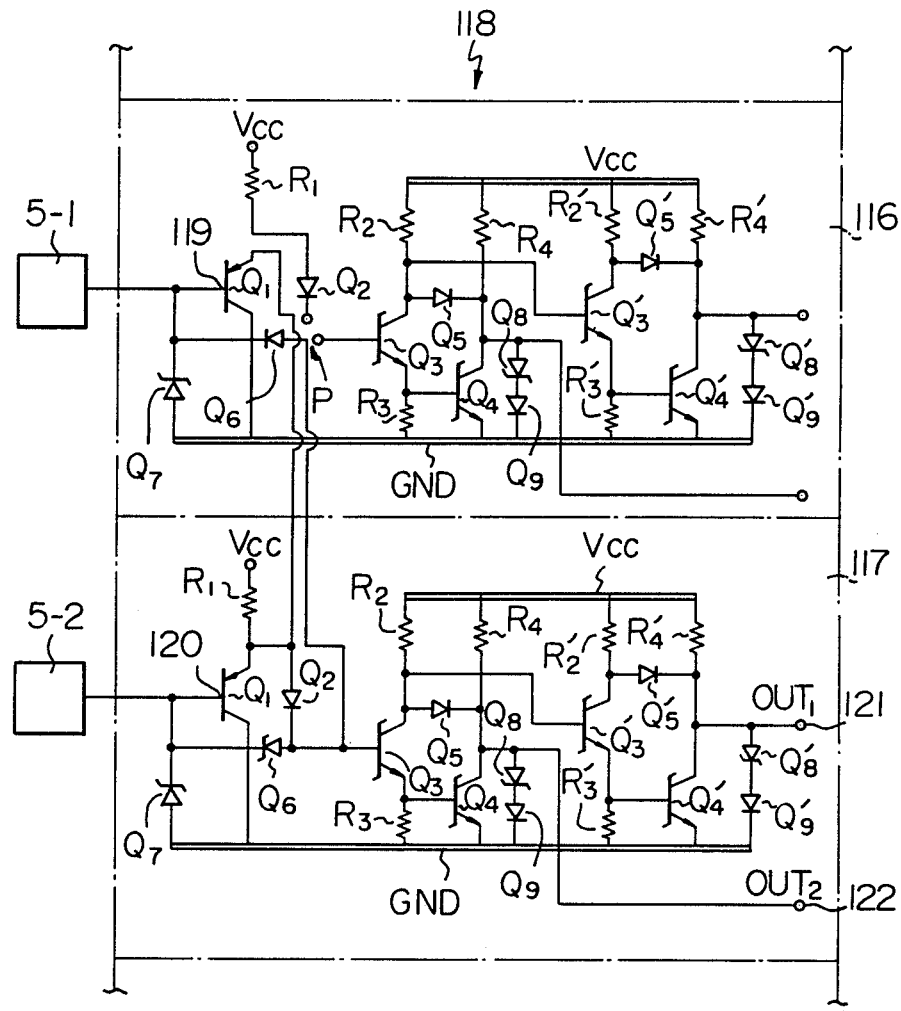
FIG. 15 is a detailed circuit diagram of the circuit of FIG. 11.

FIG. 15 is a detailed example of the circuit shown in FIG. 11. Each of the I/O cells 116 and 117 originally comprises circuit elements $Q_1$ through $Q_9$, $Q_3'$ through $Q_5'$, $Q_8'$, $Q_9'$, $R_1$ through $R_4$, and $R_2'$ through $R_4'$. However, only the circuit elements $Q_1$, $Q_6$, and $Q_7$ of the I/O cell 116, along with all the circuit elements of the I/O cell 117, are necessary to create the macro-cell logic circuit 118 of FIG. 11. The inverting output 121 and the non-inverting output 122 produce output signals $OUT_1$, and $OUT_2$, respectively. Since the circuit elements of the I/O cell 116 other than the circuit elements $Q_1$, $Q_6$, and $Q_7$ are not necessary to create the macro-cell logic circuit 118, the lines connected to these non-used circuit elements are cut at a portion P.

As apparent from the above, a person skilled in the art can create various kinds of macro-cell logic circuits by combining two or more I/O cells 3. For example, a well-known latch circuit, exclusive OR (EOR) circuit, and exclusive NOR (ENOR) can be created as macro-cell logic circuits.

As mentioned above, according to the present invention, it is also possible to operate the I/O cells as macrocell logic circuits, in which a plurality of I/O cells, each having the same pattern, are prearranged in advance by lines so as to obtain desired logic functions. Therefore, a large variety of logic circuits can be fabricated in the I/O cell region 4, as compared with that of the identical conventional type LSI chip. This means that the efficiency of utilization of not only the inner cells but also the I/O cells is remarkably increased. In this case, additional circuit elements other than the circuit elements of the I/O cells can be mounted in the aforesaid empty region. Accordingly, in spite of these additional circuit elements, the size of the LSI chip still remains as it is.

We claim:

1. A semiconductor integrated circuit operatively connected to receive external input signals, comprising:
   a semiconductor substrate having a center portion and a peripheral portion;
   a plurality of identical input/output signal pads arranged regularly along the periphery of the semiconductor substrate;
   first and second level wiring layers formed on said semiconductor substrate, said second level wiring layer being formed over said first level wiring layer;
   an inner cell region, formed on said center portion of said semiconductor substrate, having a plurality of inner cells, arranged as a gate array, operatively connected to each other by said second wiring layer, each of said plurality of inner cells comprising a plurality of circuit elements interconnected by said first level wiring layer;
   an outer cell region, located adjacent to said input-/output signal pads and between said input/output signal pads and said inner cell region, having a plurality of identical outer cells arranged regularly as a gate array, each of said outer cells initially having a same pattern, each of said input/output signal pads assigned to a corresponding one of said outer cells, each of said outer cells having a level conversion function and including a plurality of circuit elements, different from said plurality of circuit elements of said inner cell region, interconnected by said first level wiring layer, said plurality of circuit elements in said outer cell region being selectively connected to each other, so that at least two adjacent outer cells form a macro cell which performs a logic-function different from that realized by any single one of the other outer cells; and
   a power line layer, formed on said second level wiring layer and above said outer cells.

2. A semiconductor integrated circuit as set forth in claim 1, wherein said first level wiring layer selectively connects said plurality of circuit elements included in first and second ones of said plurality of outer cells.

3. A semiconductor integrated circuit as set forth in claim 1, wherein at least one of said plurality of outer cells comprises one input for receiving the external input signals and a plurality of outputs for producing output signals therefrom.

4. A semiconductor integrated circuit as set forth in claim 3, wherein said output signals are all noninverted signals with respect to the external input signals.

5. A semiconductor integrated circuit as set forth in claim 3, wherein said output signals are all inverted signals with respect to the external input signals.

6. A semiconductor integrated circuit as set forth in claim 3, wherein said output signals
   comprise inverted signals and non-inverted signals with respect to the external input signals.

7. A semiconductor integrated circuit as set forth in claim 1, wherein said macro-cell comprises gate means for receiving a single external input signal and producing a plurality of inverted signals with respect to said single external input signal, said inverted signals being input to said inner cell region.

8. A semiconductor integrated circuit as set forth in claim 1, wherein said macro-cell comprises gate means for receiving a single external input signal and producing a plurality of non-inverted signals with respect to said single external input signal, said non-inverted signals being input to said inner cell region.

9. A semiconductor integrated circuit as set forth in claim 1, wherein said macro-cell comprises gate means for receiving a single external input signal and producing inverted and non-inverted signals with respect to said single external input signal, said inverted and non-inverted signals being input to said inner cell region.

10. A semiconductor integrated circuit as set forth in claim 1, wherein said macro-cell comprises a multi-input logic gate operatively connected to receive the external input signals, 11. A semiconductor integrated circuit as set forth in claim 10, wherein said multi-input logic gate is a multi-input NAND gate.

12. A semiconductor integrated circuit as set forth in claim 10, wherein said multi-input logic gate is a multi-input AND gate.

13. A semiconductor integrated circuit as set forth in claim 10, wherein said multi-input logic gate is a multi-input latch gate.

14. A semiconductor integrated circuit, operatively connected to receive external input signals, comprising:
- a semiconductor substrate having a center portion and a peripheral portion;
- a plurality of identical input/output signal pads arranged regularly along the periphery of said semiconductor substrate;
- at least one wiring layer formed on said semiconductor substrate;
- an inner cell region formed on said center portion of said semiconductor substrate, having a plurality of inner cells arranged as a gate array and operatively connected to each other by said at least one wiring layer, each of said plurality of inner cells formed from a plurality of first circuit elements interconnected by said at least one wiring layer; and
- an outer cell region located adjacent to said input/output signal pads and between said input/output signal pads and said inner cell region, having a plurality of identical outer cells arranged regularly as a gate array, each of said outer cells initially having the same pattern, each of said input/output signal pads assigned to a corresponding one of said outer cells and having a level conversion function and including a plurality of second circuit elements, different from said first circuit elements, interconnected by said at least one wiring layer, said plurality of second circuit elements in said outer cell region being selectively connected to each other so that at least two adjacent outer cells form a macro cell which performs a logic function different from that which any one of the other outer cells is capable of performing.

* * * * *

UNITED STATES PATENT AND TRADEMARK OFFICE
CERTIFICATE OF CORRECTION

PATENT NO. : 4,868,630
DATED : SEPTEMBER 19, 1989
INVENTOR(S) : TETSU TANIZAWA ET AL.

It is certified that error appears in the above-identified patent and that said Letters Patent is hereby corrected as shown below:

FRONT PAGE [57] ABSTRACT,
        line 8, after "connected" insert --to--.

Col. 1,   line 14, "invention abandoned in favor of U.S. Pat. No. 750,641" should be --invention.--;
            line 15, delete line in its entirety;
            line 16, delete line in its entirety.

Col. 2,   line 27, "exmaple" should be --example--;
            line 52, "(I)" should be --(F)--.

Col. 5,   line 36, "prearranged" should be --prearranging--.

Col. 8,   line 56, "Figures (a)-(j)" should be --FIGS. 13(A)-(F)--.

Col. 9,   line 8, delete "of".

Signed and Sealed this.

Eighteenth Day of September, 1990

Attest:

HARRY F. MANBECK, JR.

*Attesting Officer*          *Commissioner of Patents and Trademarks*